(12) United States Patent
Li et al.

(10) Patent No.: US 9,502,259 B2
(45) Date of Patent: Nov. 22, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Jhen-Cyuan Li, New Taipei (TW); Shui-Yen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 3 days.

(21) Appl. No.: 14/533,105

(22) Filed: Nov. 5, 2014

(65) Prior Publication Data
US 2016/0104627 A1   Apr. 14, 2016

(30) Foreign Application Priority Data

Oct. 9, 2014   (CN) .......................... 2014 1 0527948

(51) Int. Cl.
| | | |
|---|---|---|
| *H01L 27/108* | (2006.01) | |
| *H01L 29/94* | (2006.01) | |
| *H01L 21/308* | (2006.01) | |
| *H01L 29/66* | (2006.01) | |
| *H01L 29/78* | (2006.01) | |
| *H01L 21/02* | (2006.01) | |
| *H01L 21/311* | (2006.01) | |

(52) U.S. Cl.
CPC ....... *H01L 21/3081* (2013.01); *H01L 21/3085* (2013.01); *H01L 21/3086* (2013.01); *H01L 29/66795* (2013.01); *H01L 29/785* (2013.01); *H01L 21/02057* (2013.01); *H01L 21/31116* (2013.01)

(58) Field of Classification Search
CPC ........... H01L 21/0217; H01L 29/7846; H01L 9/66795; H01L 29/785; H01L 29/0657; H01L 21/0206; H01L 21/02362
See application file for complete search history.

(56) References Cited

U.S. PATENT DOCUMENTS

| | | | |
|---|---|---|---|
| 7,678,648 B2 | 3/2010 | Torek et al. | |
| 2008/0196876 A1* | 8/2008 | Cao | ........................... F28F 1/36 165/181 |
| 2009/0260792 A1* | 10/2009 | Yalin | ..................... B21C 37/207 165/181 |
| 2013/0105867 A1 | 5/2013 | Wang et al. | |
| 2014/0008734 A1* | 1/2014 | Lu | ....................... H01L 21/2652 257/401 |
| 2016/0027903 A1* | 1/2016 | Chang | ................... H01L 29/785 438/283 |

* cited by examiner

*Primary Examiner* — Thanh Y Tran
(74) *Attorney, Agent, or Firm* — Winston Hsu; Scott Margo

(57) ABSTRACT

A method for fabricating semiconductor device is disclosed. The method includes the steps of: providing a substrate; forming a fin-shaped structure on the substrate; forming a cap layer on the fin-shaped structure; removing part of the cap layer on top of the fin-shaped structure; removing part of the fin-shaped structure; removing the remaining cap layer; and removing part of the remaining fin-shaped structure.

5 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of using two-step etching process for removing part of fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, conventional FinFET fabrication of forming recesses after removing part of fin-shaped structures to accommodate the growth of epitaxial layer typically causes the fin-shaped structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

According to a preferred embodiment of the present invention, a method for fabricating semiconductor device is disclosed. The method includes the steps of: providing a substrate; forming a fin-shaped structure on the substrate; forming a cap layer on the fin-shaped structure; removing part of the cap layer on top of the fin-shaped structure; removing part of the fin-shaped structure; removing the remaining cap layer; and removing part of the remaining fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
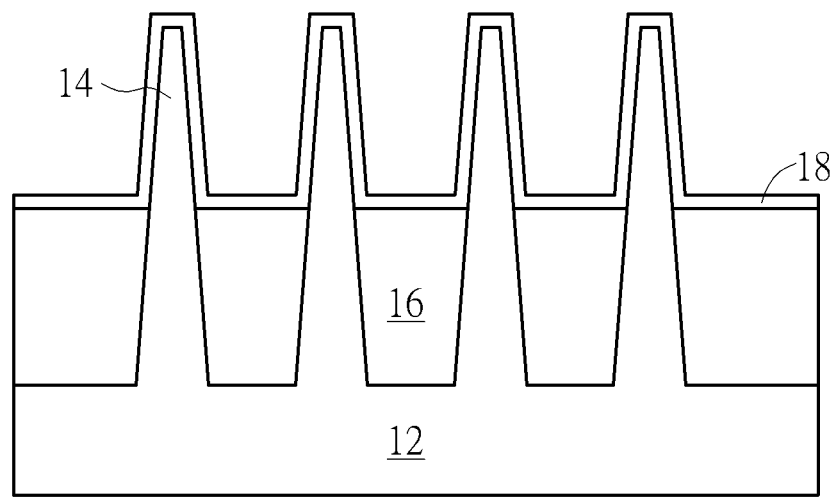
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12, such as a silicon substrate or silicon-on-insulator (SOI) substrate is first provided. At least one fin-shaped structure 14 is formed on the substrate 12, and a shallow trench isolation (STI) 16 is formed around the fin-shaped structure 14. It should be noted that even though four fin-shaped structures 14 are represented in this embodiment, the quantity of the fin-shaped structures 14 is not limited to four, but could be any quantity greater than one.

In addition, the fin-shaped structures 14 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate, and through additional fin cut processes, desirable pattern structures, such as stripe patterned fin-shaped structures could be obtained.

The fin-shaped structures 14 of this embodiment could also be obtained by first forming a patterned mask (not shown) on the substrate, 12, and through an etching process, the pattern of the patterned mask is transferred to the substrate 12 to form the fin-shaped structures. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming the fin-shaped structures 14 are all within the scope of the present invention.

Next, fabrications involving the formation of gate structure and source/drain regions could be conducted. For instance, gate structures (not shown) could be formed on the substrate 12, lightly doped drains (not shown) could be formed in the fin-shaped structures 14 adjacent to the gate structure, spacers could be formed on the sidewalls of the gate structures, and source/drain regions could be formed in the fin-shaped structures 14 adjacent to the spacer. Next, a cap layer 18 is covered on the aforementioned gate structures, STI 16, and fin-shaped structures 14, in which the cap layer 18 preferably covers the entire fin-shaped structures 14 and the surrounding STI 16. In this embodiment, the cap layer 18 is composed of silicon nitride, but not limited thereto.

Figure 2:
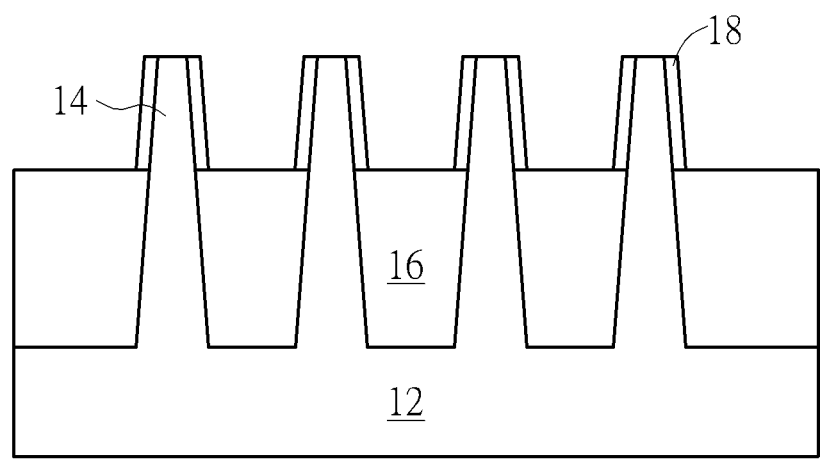

Next, as shown in FIG. 2, an etching process is conducted to remove part of the cap layer 18 above the fin-shaped structures 14 and part of the cap layer 18 above the STI 16 for exposing the top surface of the fin-shaped structures 14 and part of the top surface of the STI 16. It should be noted that the formation of the cap layer 18 and removal of part of the cap layer 18 is preferably conducted corresponding to formation and removal of the cap layer 18 in different transistor regions on the substrate 12. For instance, the cap layer 18 in FIG. 1 is preferably formed on NMOS region (not shown) and PMOS region (not shown) of the substrate 12 simultaneously, and the removal of part of the cap layer 18 in FIG. 2 is accomplished by covering a pattered resist (not shown) on one of the transistor regions (such as the NMOS region) and then performing an etching process to remove part of the cap layer from the PMOS region. Since the approach of using patterned resist to conduct the aforementioned pattern transfer process in different transistor regions is well known to those skilled in the art, the details of which are not explained herein for the sake of brevity.

Figure 3:
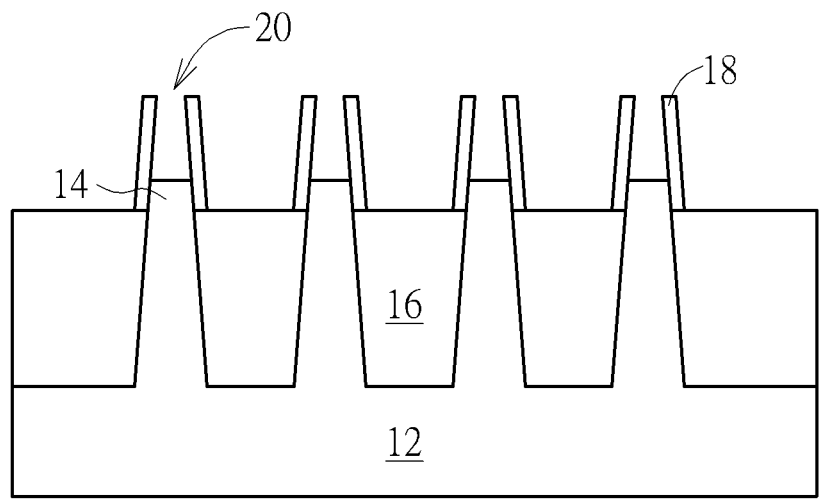

Next, as shown in FIG. 3, another etching process is conducted to remove part of the fin-shaped structures 14 to form a recess 20 while none of the cap layer 18 damaged, such that the top surface of the remaining fin-shaped structures 14 is higher than the top surface of the STI 16. Preferably, the removal of part of the fin-shaped structures 14 is accomplished by using an etching gas composed of HBr, but not limited thereto.

Figure 4:
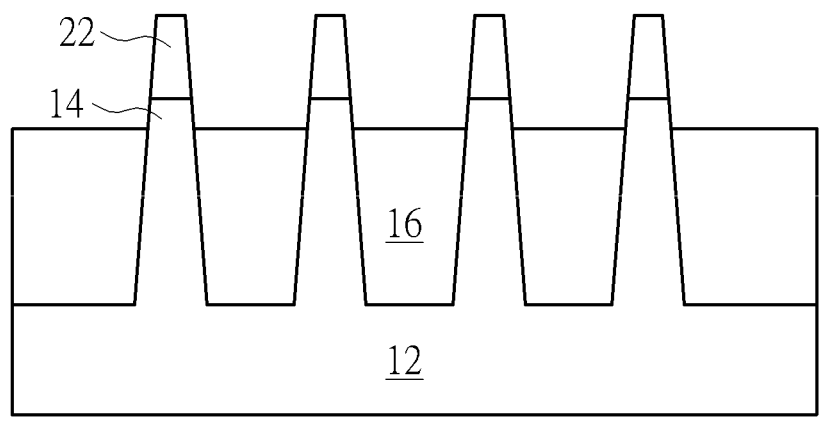

Next, as shown in FIG. 4, an etching is conducted thereafter to remove the remaining cap layer 18 while forming a polymer layer 22 on the remaining fin-shaped structures 14, in which the polymer layer 22 is primarily composed of long carbon chains with polymers containing fluoride. In this embodiment, etching gas used to remove the remaining cap layer 18 and forming the polymer layer 22 is preferably selected from the group consisting $CH_3F$, $CH_2F_2$ and $CH_4$. Specifically, as the aforementioned etching process is preferably accomplished by etching gas containing fluoride, the variation of etching gas composition could include $CH_3F$ and $CH_4$, $CH_2F_2$ and $CH_4$, or $CH_3F$, $CH_2F_2$ and $CH_4$.

Figure 5:
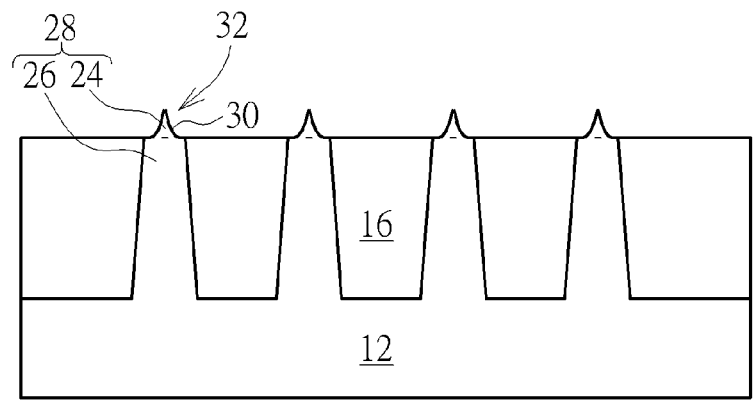
Figure 6:
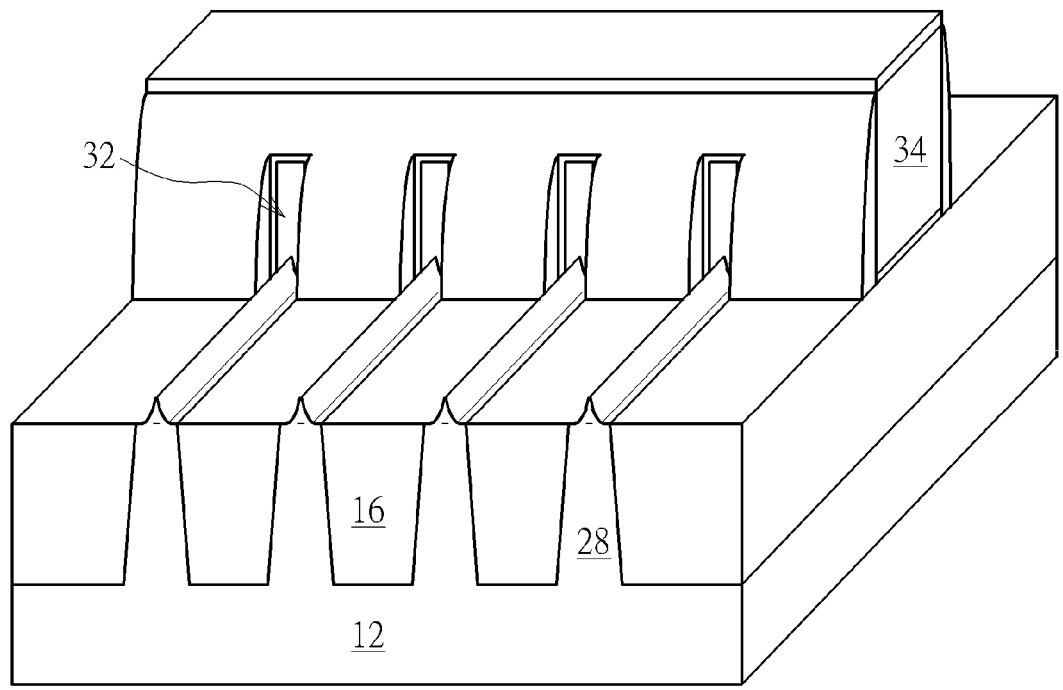

Next, as shown in FIGS. 5-6, another etching process is conducted to remove the polymer layer 22 and part of the remaining fin-shaped structures 14 for forming a plurality of recesses 32 adjacent to two sides of the gate structures 34. The recesses 32 will be used to form epitaxial layer thereafter and etching gas used for removing the polymer layer 22 and part of the fin-shaped structures 14 is selected from the group consisting of Cl and $NF_3$. It should be noted that after the polymer layer 22 and part of the fin-shaped structures 14 are removed, fin-shaped structures 28 having a top portion 24 and a bottom portion 26 are formed. The top portion 24 preferably includes two concave arcs 30 opposite to each other, or viewing from another direction, the top portion 24 includes two side surfaces and the slope of the two side surfaces are different from the slope of the bottom portion 26. If viewing the device as a whole, the top surface of the bottom portion 26 of the fin-shaped structure 28 is preferably larger than the bottom surface of the top portion 24, and the top surface of the bottom portion 26 or the bottom surface of the top portion 24 is preferably even with the top surface of the STI 16.

Figure 7:
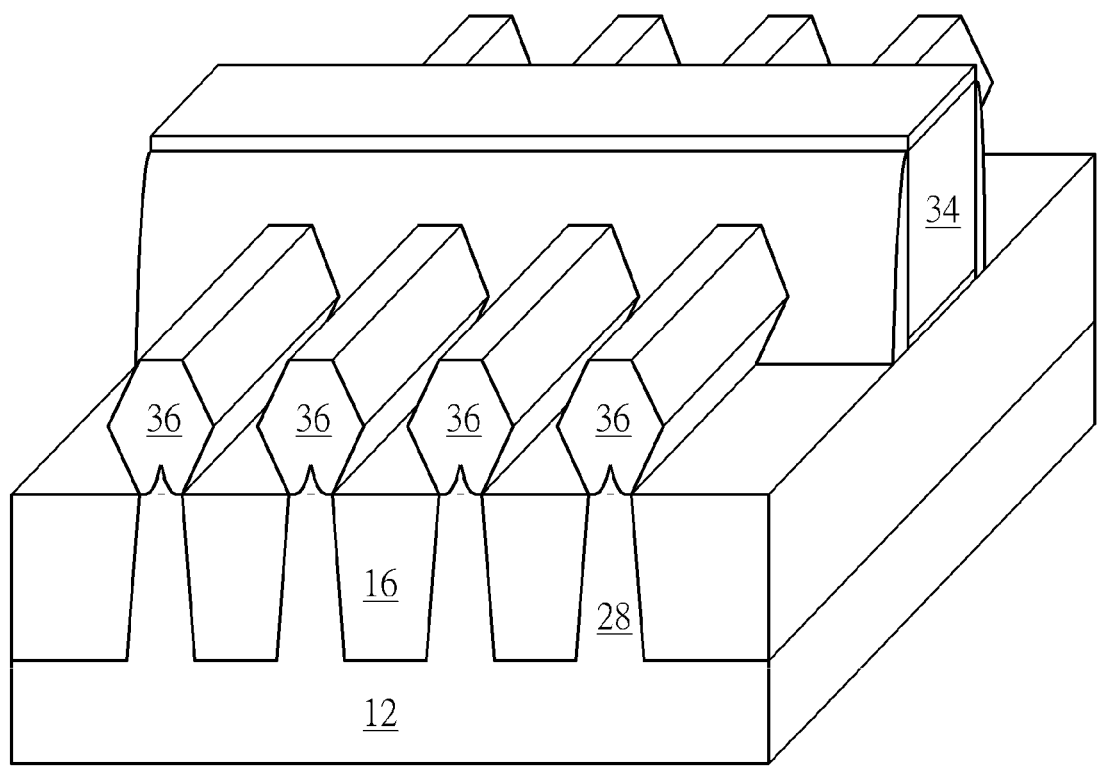

After removing part of the remaining fin-shaped structures 28, a $O_2$ plasma cleaning process is conducted depending on the demand of the product to remove any of the remaining polymer layer 22 while stripping patterned resist from another transistor region, such as the NMOS region disclosed previously. Next, as shown in FIG. 7, epitaxial layers 36 are formed on the fin-shaped structures 28, and standard FinFET processes including formation of silicides and contact plugs could be carried out thereafter.

Overall, the present invention discloses an approach of utilizing multi-step etching process to remove part of fin-shaped structures, which preferably uses an etching gas composed of HBr to remove part of the fin-shaped structures after part of the cap layer is removed to expose the top surface of the fin-shaped structures, using etching gas containing fluorine to remove cap layer for forming a polymer layer on the fin-shaped structures, and then using etching gas containing Cl and $NF_3$ to remove polymer layer for forming fin-shaped structures with top portion and bottom as the slopes of these two portions are substantially different. By using multi-step etching approach to remove part of the fin-shaped structures for forming recesses used for epitaxial growth afterwards, the present invention could prevent fin-shaped structures suffer from over-etching while increasing the quality of epitaxial layer grown in the later process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate; and
a fin-shaped structure having a top portion and a bottom portion on the substrate, wherein the top surface of the bottom portion is greater than the bottom surface of the top portion and the fin-shaped structure comprises a source/drain region.
2. The semiconductor device of claim 1, further comprising a shallow trench isolation (STI) around the fin-shaped structure.
3. The semiconductor device of claim 2, wherein the top surface of the bottom portion is even with the top surface of the STI.
4. The semiconductor device of claim 1, wherein the top portion comprises two concave arcs opposite to each other.
5. The semiconductor device of claim 1, wherein the top portion comprises two side surfaces, and the slope of the two side surfaces are different from the slope of the bottom portion.

* * * * *